(12) United States Patent
Kang et al.

(10) Patent No.: US 12,557,523 B2
(45) Date of Patent: Feb. 17, 2026

(54) DISPLAY DEVICE AND MANUFACTURING METHOD THEREOF

(71) Applicant: LG Display Co., Ltd., Seoul (KR)

(72) Inventors: Daeil Kang, Paju-si (KR); Joungwon Woo, Paju-si (KR); Gihong Kim, Paju-si (KR); Jaekyeong Yun, Paju-si (KR); Samjong Lee, Paju-si (KR); Dojoong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 565 days.

(21) Appl. No.: 17/972,259

(22) Filed: Oct. 24, 2022

(65) Prior Publication Data

US 2023/0209865 A1    Jun. 29, 2023

(30) Foreign Application Priority Data

Dec. 29, 2021 (KR) .................. 10-2021-0190656

(51) Int. Cl.
| | |
|---|---|
| *H01L 51/52* | (2006.01) |
| *H10K 50/856* | (2023.01) |
| *H10K 59/122* | (2023.01) |
| *H10K 59/80* | (2023.01) |
| *H10K 71/00* | (2023.01) |
| *H10K 59/12* | (2023.01) |

(52) U.S. Cl.
CPC ..... *H10K 59/80522* (2023.02); *H10K 50/856* (2023.02); *H10K 59/122* (2023.02); *H10K 71/00* (2023.02); *H10K 59/1201* (2023.02)

(58) Field of Classification Search
CPC ........... H10K 59/80522; H10K 50/856; H10K 59/122; H10K 71/00; H10K 59/1201; H10K 59/1315; H10K 2102/3026; H10K 50/824; H10K 50/844; H10K 71/60
See application file for complete search history.

(56) References Cited

U.S. PATENT DOCUMENTS

| | | |
|---|---|---|
| 2016/0155790 A1 | 6/2016 | Lee et al. |
| 2016/0293888 A1 | 10/2016 | Shim et al. |

(Continued)

FOREIGN PATENT DOCUMENTS

| | | |
|---|---|---|
| JP | 2009-295479 A | 12/2009 |
| JP | 2010-217667 A | 9/2010 |

(Continued)

*Primary Examiner* — Mohammed R Alam
(74) *Attorney, Agent, or Firm* — Birch, Stewart, Kolasch & Birch, LLP

(57) ABSTRACT

A display device can include a substrate including a light emitting area and an auxiliary electrode contact portion for providing an electrical connection with one or more elements, an auxiliary electrode disposed in the auxiliary electrode contact portion and having an electrode hole, a transparent conductive layer covering the auxiliary electrode and having a concave portion above the electrode hole, at least one bank disposed on the transparent conductive layer and exposing the concave portion and an upper surface of the transparent conductive layer that is adjacent to the concave portion, an organic layer disposed on the at least one bank and the exposed upper surface of the transparent conductive layer, and a cathode electrode disposed on the organic layer and a side surface of the concave portion.

14 Claims, 16 Drawing Sheets

(56) References Cited

U.S. PATENT DOCUMENTS

2021/0134893 A1    5/2021   Lee et al.
2021/0175460 A1*   6/2021   Baek .................. H10K 59/1315
2021/0193954 A1    6/2021   Shin

FOREIGN PATENT DOCUMENTS

| JP | 2015-69854 A | 4/2015 |
| JP | 2018-97361 A | 6/2018 |
| JP | 2018-109758 A | 7/2018 |
| KR | 10-2017-0139957 A | 12/2017 |
| KR | 10-2018-0066320 A | 6/2018 |
| KR | 10-2021-0079615 A | 6/2021 |

* cited by examiner

DISPLAY DEVICE AND MANUFACTURING METHOD THEREOF

CROSS REFERENCE TO RELATED APPLICATION

The present application claims priority to Korea Patent Application No. 10-2021-0190656, filed in the Republic of Korea on Dec. 29, 2021, the entire contents of which are expressly incorporated by reference into the present application.

BACKGROUND

Field

The present disclosure relates to a display device and a manufacturing method thereof.

Description of the Related Art

As the information society advances, various types of display devices are being developed. Recently, a liquid crystal display (LCD), a plasma display panel (PDP), an organic light emitting display (OLED) and various other types of display devices are utilized.

An organic light emitting display device including organic light emitting diodes is a self-emitting type which does not require a separate light source and thus a thickness and weight of such a display device can be reduced. In addition, the organic light emitting display device has high-grade properties such as low power consumption, high luminance and faster response speed and the like.

In a display panel, a light emitting area and an auxiliary electrode contact portion adjacent to the light emitting area can be present. To further improve the performance of the display panel, an improved auxiliary electrode contact portion can be desired.

SUMMARY OF THE DISCLOSURE

The embodiments of the present disclosure provide a display device that directly contacts a cathode electrode and an auxiliary electrode through a patterned auxiliary electrode structure, and a manufacturing method thereof.

One embodiment of the present disclosure provides a display device comprising a substrate including a light emitting area and an auxiliary electrode contact portion, an auxiliary electrode disposed in the auxiliary electrode contact portion and having an electrode hole, a transparent conductive layer covering the auxiliary electrode and having a concave portion above the electrode hole, a first bank exposing a periphery of the concave portion of the transparent conductive layer and covering a remaining area, a second bank formed on the first bank, an organic layer formed on the second bank and the exposed transparent conductive layer, and a cathode electrode formed on the organic layer.

The cathode electrode can directly contact with an inner side surface of the concave portion.

The organic layer can be cut off from the periphery of the concave portion and expose the inner side surface of the concave portion, and the cathode electrode can be the exposed inner side surface of the concave portion.

The transparent conductive layer can be formed to cover the auxiliary electrode as a whole and to have a wider area than the auxiliary electrode.

The auxiliary electrode can have a structure where a first transparent conductive layer, a reflective layer and a second transparent conductive layer are stacked, and the reflective layer can be exposed on an inner side surface of the electrode hole and can be covered by the transparent conductive layer.

The reflective layer can be further recessed from the inner side surface of the electrode hole than the first conductive layer and the second conductive layer.

The reflective layer can have a side surface in a reverse taper shape, and the concave portion of the transparent conductive layer can have a reverse taper shape along the shape of the reflective layer.

The reflective layer can have a side surface in a taper shape, and the concave portion of the transparent conductive layer can have a taper shape along the shape of the reflective layer.

The auxiliary electrode can have a structure where a first transparent conductive layer and a reflective layer are stacked, and the exposed reflective layer can be covered as a whole by the transparent conductive layer.

The auxiliary electrode can have a structure where a first transparent conductive layer is stacked, and the first transparent conductive layer can be covered as a whole by the transparent conductive layer.

Another embodiment of the present disclosure provides a method for manufacturing a display device includes forming an auxiliary electrode in an auxiliary electrode contact portion of a substrate comprising a light emitting area and the auxiliary electrode contact portion, forming a transparent conductive layer covering the auxiliary electrode, forming a bank exposing at least one area of the transparent conductive layer and covering a remaining area, forming an organic layer on the bank and the exposed transparent conductive layer, and forming a cathode electrode on the organic layer.

The transparent conductive layer can be formed to cover the auxiliary electrode as a whole and to have a wider area than the auxiliary electrode.

The forming an auxiliary electrode can include stacking a first transparent conductive layer, a reflective layer and a second transparent conductive layer, and forming an electrode hole by performing an etching process in a state a mask is applied, and the reflective layer can be exposed on an inner side surface of the electrode hole and can be covered by the transparent conductive layer.

The reflective layer can be over-etched than the first transparent conductive layer and the second transparent conductive layer during the etching process.

The forming a bank can include forming an insulating layer, forming the bank by fulfilling an etching process in a state a mask is applied, and removing the mask by fulfilling an ashing process.

The organic layer and the cathode electrode can be formed to have a wide area in the substrate through an evaporation deposition method or a physical vapor deposition method.

According to an embodiment of the present disclosure, a display device can include a substrate including a light emitting area and an auxiliary electrode contact portion for providing an electrical connection with one or more elements, an auxiliary electrode disposed in the auxiliary electrode contact portion and having an electrode hole, a transparent conductive layer covering the auxiliary electrode and having a concave portion above the electrode hole, at least one bank disposed on the transparent conductive layer, and exposing the concave portion and an upper surface of the transparent conductive layer that is adjacent to the concave portion, an organic layer disposed on the at least one bank and the exposed upper surface of the transparent conductive layer, and a cathode electrode disposed on the organic layer and a side surface of the concave portion.

According to an embodiment of the present disclosure, a display device can include a substrate including a light emitting area and an auxiliary electrode contact portion for providing an electrical connection with one or more elements, a transparent conductive layer disposed in the auxiliary electrode contact portion and functioning as an auxiliary electrode and having a concave portion, at least one bank disposed on the transparent conductive layer and exposing the concave portion and an upper surface of the transparent conductive layer that is adjacent to the concave portion, an organic layer disposed on the at least one bank and the exposed upper surface of the transparent conductive layer, and a cathode electrode disposed on the organic layer and contacting an inner side surface of the concave portion of the transparent conductive layer.

According to an embodiment of the present disclosure, a method for manufacturing a display device can include providing a substrate including a light emitting area and an auxiliary electrode contact portion, forming an auxiliary electrode in the auxiliary electrode contact portion of the substrate, forming a transparent conductive layer covering the auxiliary electrode, forming at least one bank that exposes an area of the transparent conductive layer while covering a remaining area of the transparent conductive layer, forming an organic layer on the at least one bank and the exposed area of the transparent conductive layer, and forming a cathode electrode on the organic layer.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
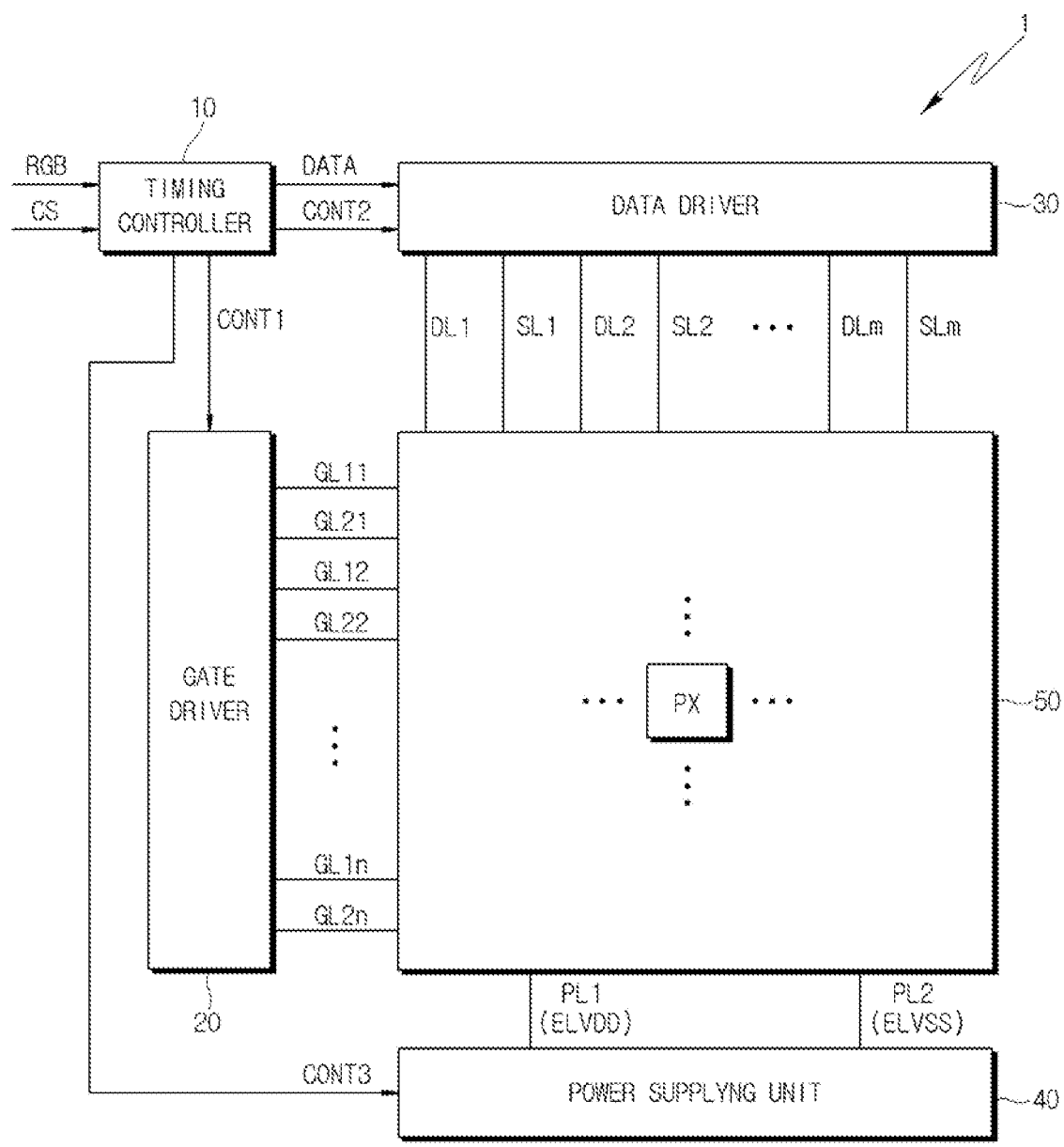
FIG. 1 is a block diagram showing a configuration of a display device according to an embodiment of the present disclosure.

Hereinafter, various embodiments will be explained with reference to drawings. When an element (or an area, a layer, a part and the like) is 'on' another element, is 'connected' with, is 'contacted', or 'coupled' to another element, the element can be directly connected with or coupled to another element or one or more intervening elements can be disposed therebetween.

Like reference numerals of the accompanying drawings denote like elements. In addition, thicknesses, proportions and dimensions of the elements in the accompanying drawings are exaggerated for convenience of describing the technical contents. The term "and/or" includes any and all combinations of one or more of the associated listed items.

Though terms such as 'a first', 'a second', 'a third', etc. are used to describe various components, these components are not confined by these terms. These terms are merely used to distinguish one component from the other component and may not define any order. For example, without departing from the scope of the rights of various embodiments of the present invention, a first component can be referred to as a second component, and similarly, a second component can be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept, and are explained based on the directions marked in the drawings.

It should be understood that terms such as 'comprise', 'include' or 'have' and the like are used only to designate that there are features, numbers, steps, operations, components, parts or combination thereof. However such terms do not preclude existence or addition of one or more another features, numbers, steps, operations, components, parts or combination thereof.

Further, all components of each display device according to all embodiments of the present disclosure are operatively coupled and configured.

FIG. 1 is a block diagram showing a configuration of a display device according to an embodiment of the present disclosure.

Referring to FIG. 1, a display device 1 includes a timing controller 10, a gate driver 20, a data driver 30, a power supplying unit 40 and a display panel 50. The display panel 50 includes a plurality of pixels PX.

The timing controller 10 can receive a video signal (RGB) and a control signal (CS) from the outside. The video signal (RGB) can include a plurality of grayscale data. The control signal (CS) can include, for example, a horizontal synchronizing signal, a vertical synchronizing signal, a main clock signal, etc.

The timing controller 10 processes the video signal (RGB) and the control signal (CS) to be suitable to operational conditions of the display panel 50, and can generate and output video data (DATA), a gate driving control signal (CONT1), a data driving control signal (CONT2) and a power supply control signal (CONT3).

The gate driver 20 can generate gate signals based on the gate driving control signal (CONT1) outputted by the timing controller 10. The gate driver 20 can provide the generated gate signals to the pixels (PX) through a plurality of first gate lines (GL11~GL1n where n can be an integer greater than 1). The gate driver 20 can provide a sensing signal to the pixels (PX) through a plurality of second gate lines (GL21~GL2n). The sensing signal can be supplied to measure the characteristics of a driving transistor and/or a light emitting diode included in the pixels (PX).

The data driver 30 can generate data signals based on the video data (DATA) and the data driving control signal (CONT2) outputted by the timing controller 10. The data driver 30 can provide the generated data signals to the pixels (PX) through a plurality of data lines (DL1~DLm where m can be an integer greater than 1). The data driver 30 can provide a reference voltage (or, sensing voltage, initialization voltage) to the pixels (PX) through a plurality of sensing lines (SL1~SLm where m can be an integer greater than 1) or, can sense states of the pixels (PX) based on an electric signal being fed back from the pixels (PX).

Based on the power supply control signal (CONT3), the power supplying unit 40 can generate a high potential driving voltage (ELVDD) and a low potential driving voltage (ELVSS) which are to be supplied to the display panel 50. The power supplying unit 40 can provide the generated driving voltages (ELVDD, ELVSS) to the pixels (PX) through power lines (PL1, PL2), respectively.

In the display panel 50, the plurality of pixels (PX)(or, also referred to as sub-pixels) are disposed. The pixels (PX) can be, for example, disposed in a form of a matrix or in other suitable configuration in the display panel 50. The pixels (PX) can emit light at luminance corresponding to the gate signal and the data signal being supplied through the first gate lines (GL11~GL1n) and the data lines (DL1~DLm).

In one example, each pixel (PX) can display one color among red, green and blue. In another example, each pixel (PX) can display one color among cyan, magenta and yellow. In another example, each pixel (PX) can display one color among red, green, blue and white. In still another example, each pixel (PX) can display any one of the known colors suitable for pixels or sub pixels.

The timing controller 10, the gate driver 20, the data driver 30 and the power supplying unit 40 each can be configured as a separate integrated circuit (IC), or at least some of them can be integrated into an integrated circuit. Moreover, at least one among the gate driver 20 and the data driver 30 can be configured in In-Panel method through which the drivers are integrated into the display panel 50.

Figure 2:
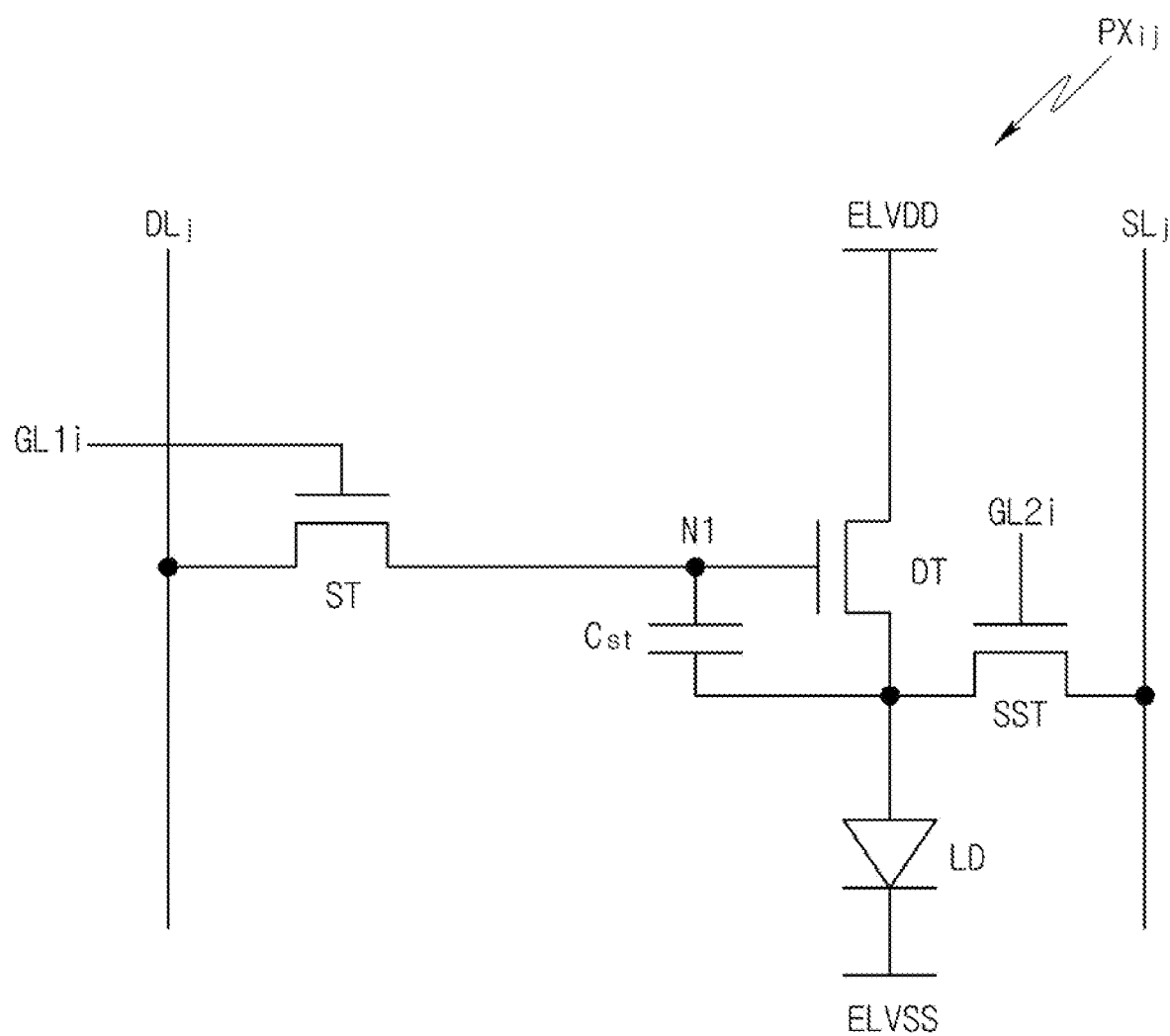
FIG. 2 is a circuit diagram showing an example of a pixel illustrated in FIG. 1.

FIG. 2 is a circuit diagram showing an example of a pixel illustrated in FIG. 1. Particularly, FIG. 2 illustrates a pixel (PXij) connected to the i-th first gate line (GL1i) and the j-th data line (DLj) as an example. Each pixel PX in the display panel 50 of FIG. 1 can have the same or similar configuration as that shown in FIG. 2.

Referring to FIG. 2, the pixel (PX) includes a switching transistor (ST), a driving transistor (DT), a sensing transistor (SST), a storage capacitor (Cst) and a light emitting diode (LD).

The first electrode of the switching transistor (ST) is electrically connected to the j-th data line (DLj), and the second electrode of the switching transistor (ST) is electrically connected to the first node (N1). A gate electrode of the switching transistor (ST) is electrically connected to the i-th first gate line (GL1i). The switching transistor (ST) is turned on when the gate signal of a gate-on level is applied to the i-th first gate line (GL1i), and delivers the data signal applied to the j-th data line (DLj) to the first node (N1).

The first electrode of the storage capacitor (Cst) is electrically connected to the first node (N1), and the second electrode of the storage capacitor (Cst) is connected to the first electrode (for example, anode electrode) of the light emitting diode (LD). The storage capacitor (Cst) can charge a voltage corresponding to a gap between a voltage applied to the first node (N1) and a voltage applied to the first electrode of the light emitting diode (LD).

The first electrode of the driving transistor (DT) is configured to be provided with the high potential driving voltage (ELVDD), and the second electrode thereof is electrically connected to the first electrode of the light emitting diode (LD). The gate electrode of the driving transistor (DT) is electrically connected to the first node (N1). The driving transistor (DT) is turned on when a voltage of a gate-on level is applied through the first node (N1) and can control quantity of a driving current flowing in the light emitting diode (LD) in response to the voltage provided to the gate electrode of the driving transistor (DT).

The first electrode of the sensing transistor (SST) is electrically connected to the j-th sensing line (SLj) and the second electrode thereof is electrically connected to the first electrode of the light emitting diode (LD). The gate electrode of the sensing transistor (SST) is electrically connected to the i-th second gate line (GL2i). The sensing transistor (SST) is turned on when the sensing signal of a gate-on level is applied to the i-th second gate line (GL2i) and delivers a reference voltage applied from the j-th sensing line (SLj) to the first electrode of the light emitting diode (LD).

The light emitting diode (LD) outputs light corresponding to the driving current. The light emitting diode (LD) can output light corresponding to one color among red, green, blue and white. The light emitting diode (LD) can be an organic light emitting diode (OLED), or an ultra-small inorganic light emitting diode having a size of microscale or nanoscale range, but the present embodiment is not limited thereto. Hereinafter, a technical concept of the present embodiment will be explained with reference to an embodiment where the light emitting diode (LD) is an organic light emitting diode.

The present embodiment is not limited to the structure of pixels (PXij) as illustrated in FIG. 2. Depending on embodiments, pixels (PXij) can compensate a threshold voltage of the driving transistor (DT), or can further include at least one element to initialize a voltage of a gate electrode of the driving transistor (DT) and/or a voltage of a first electrode of the light emitting diode (LD).

In FIG. 2, an example of having the switching transistor (ST), the driving transistor (DT) and the sensing transistor (SST) as NMOS transistors is illustrated, but the present disclosure is not limited thereto. For example, at least some of, or the entire transistors forming each pixel (PX) can be PMOS transistors. In various embodiments, each of the switching transistor (ST), the driving transistor (DT) and the sensing transistor (SST) can be implemented as a low temperature poly silicon (LTPS) thin film transistor, an oxide thin film transistor or a low temperature polycrystalline oxide (LTPO) thin film transistor.

Figure 3:
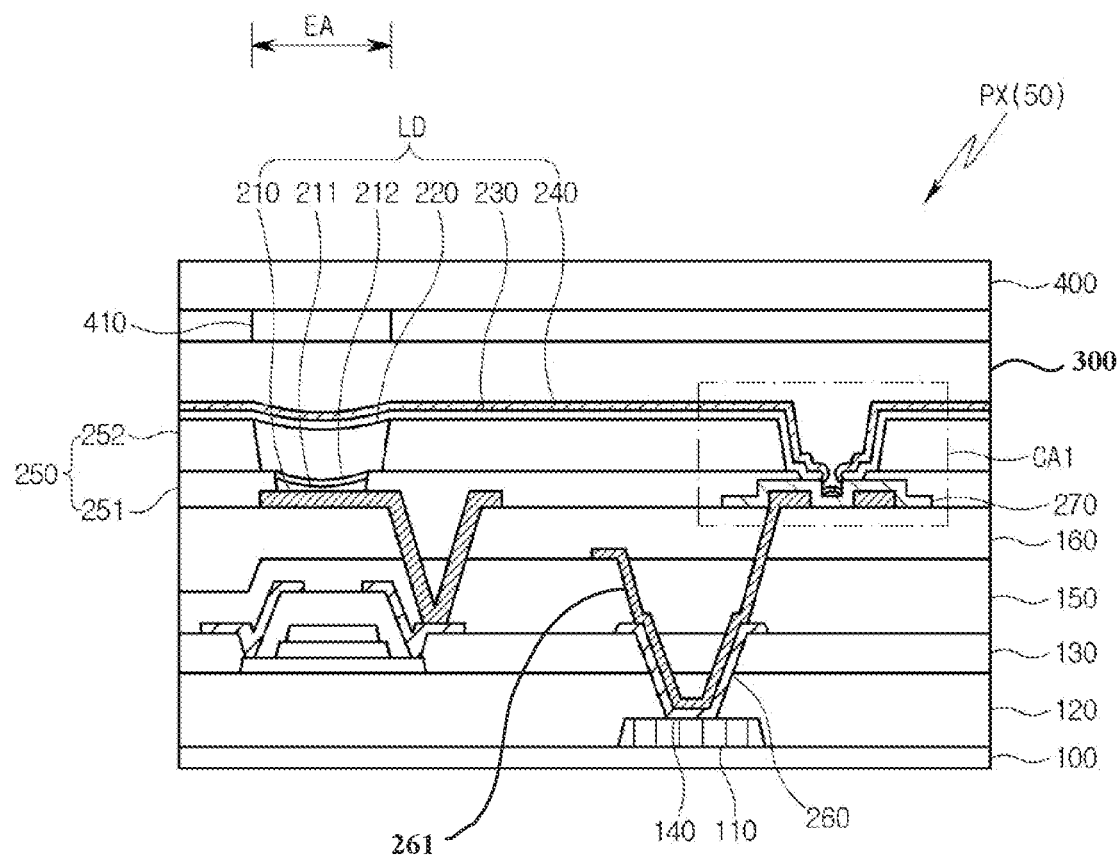
FIG. 3 is a cross-sectional view of a display panel according to an embodiment of the present disclosure.

FIG. 3 is a cross-sectional view of a display panel according to an embodiment of the present disclosure. Particularly, this figure illustrates a cross-sectional view of one example of a pixel PX in the display panel 50.

Referring to FIG. 3, each of at least one pixel (PX) in the display panel 50 according to the embodiment can include a substrate 100, a circuit element layer disposed on the substrate 100 and having at least one circuit element, and a light emitting diode layer where the light emitting diode is provided.

The substrate 100 is a base substrate of the display panel 50 and can be a transparent substrate. The substrate 100 can be a rigid substrate including glass or tempered glass, or a flexible substrate of a plastic material.

The circuit element layer is formed on the substrate 100, and can include circuit elements constituting pixels (PX)(for example, a transistor and a capacitor, and the like) and wirings.

On the substrate 100, a first conductive layer can be disposed. The first conductive layer can include an auxiliary wiring 110. The auxiliary wiring 110 can be connected to a second power line (PL2) to which the low potential driving voltage (ELVSS) is applied.

A buffer layer 120 is disposed on the substrate 100 to cover the first conductive layer. The buffer layer 120 can prevent the substrate 100 from diffusion of an ion or impurities, and can block penetration of water.

On the buffer layer 120, an insulating layer 130 can be formed. On the insulating layer 130, a second conductive layer can be disposed. The second conductive layer can include a connecting electrode 140. The connecting electrode 140 is contacted with the auxiliary wiring 110 through a contact hole penetrating the insulating layer 130 and the buffer layer 120.

The circuit element layer can be covered by a passivation layer 150 and an overcoat layer 160. The passivation layer 150 is an insulating film to protect elements disposed below, and the overcoat layer 160 can be a planarization film to eliminate a step difference of the lower part.

The light emitting diode layer is formed on the overcoat layer 160 and includes light emitting diodes (LD). The light emitting diode (LD) includes an anode electrode 210, a light emitting layer 220 and a cathode electrode 240.

The anode electrode 210 is formed on the overcoat layer 160. The anode electrode 210 can be formed of a transparent conductive material such as indium tin oxide (ITO), indium zinc oxide (IZO) or zinc oxide (ZnO) and the like. When the anode electrode 210 is a reflective electrode, the anode electrode 210 can be formed with a three-layer structure composed of a transparent conductive layer, a reflective layer (metal oxide layer) and a transparent conductive layer. For example, the anode electrode 210 can be formed with a three-layer structure including ITO/Ag/ITO.

The bank 250 can be formed on the overcoat layer 160. The bank 250 can be formed to expose some area of the anode electrode 210, for example, to cover a center area, and to cover the remaining areas for example, the edges. An exposed area of the anode electrode 210 which is not covered by the bank 250 can be defined as a light emitting area (EA) of the pixels (PX).

In the embodiment, the bank 250 can have a structure where a hydrophilic bank 251 and a hydrophobic bank 252 are alternately stacked. The hydrophilic bank 251 can expose a center area of the anode electrode 210 and cover the edges. The exposed area of the anode electrode 210, which is not covered by the hydrophilic bank 251, can be defined as the light emitting area (EA). The hydrophilic bank 251 is formed of inorganic insulating material having hydrophilic property such as a silicon dioxide (SiO2) or silicon nitride (SiNx), thereby making a solution to spread well when forming the light emitting layer 220 to be described later on.

The hydrophobic bank 252 can be formed on a portion of the hydrophilic bank 251. The hydrophobic bank 252 is disposed between the pixel rows, and can divide between the pixel rows. The hydrophobic bank 252 is configured that at least one area thereof, for example, an upper portion is configured to have a hydrophobic property to prevent color mixing between the pixel rows.

In the exposed area of the anode electrode 210 surrounded by the bank 250, the light emitting layer 220 is formed. In the embodiment, the light emitting layer 220 can be formed by a solution process. For example, a solution to form the light emitting layer 220 in the light emitting area (EA) can be applied. The solution can be manufactured by mixing organic materials forming the light emitting layer 220 with a solvent. The solution can be jetted in the light emitting area through an inkjet device having a nozzle mounted in the inkjet head and the like. The ink applied is dried and forms the light emitting layer 220. The light emitting layer 220 formed through the solution process can be formed in a way so that a surface of a center area thereof is formed lower than a surface of edges thereof.

In the embodiment, between the light emitting layer 220 and the anode electrode 210, a hole injection layer 211 (HIL) and a hole transport layer 212 (HTL) and the like can be further disposed. The hole injection layer 211 and the hole transport layer 212 can be formed through the solution process, similar to the formation of the light emitting layer 220.

On the light emitting layer 220, an organic layer 230 can be formed. The organic layer 230 can be widely formed on the substrate 100 to cover the light emitting layer 220 and the bank 250. The organic layer 230 can be formed by an evaporation deposition such as a thermal evaporation deposition, or a physics vapor deposition such as sputtering. The organic layer 230 can be, for example, an electron transport layer (ETL). The electron transport layer serves to smoothly deliver an electron injected by the cathode electrode 240 to the light emitting layer 220.

The cathode electrode 240 is formed on the organic layer 230. The cathode electrode 240 can be formed widely on the substrate 100. The cathode electrode 240 can be formed of a transparent conductive material (TCO) that can transmit light or can be formed of a semi-transmissive conductive material. The cathode electrode 240 can be formed through evaporation deposition, or a physics vapor deposition, similar to the organic layer 230. For example, the cathode electrode 240 can be formed by co-depositing silver (Ag) and magnesium (Mg), and then, depositing it on the organic layer 230.

In the embodiment, the display panel 50 can include an auxiliary electrode contact portion (CA) to connect the cathode electrode 240 to the low potential driving voltage (ELVSS). Here, the CA shown is a first example (CA1).

An encapsulation layer 300 can be formed on the cathode electrode 240. The encapsulation layer 300 serves to prevent water from the outside from penetrating into the light emitting layer 220. The encapsulation layer 300 can be formed of an inorganic insulating material, or can be formed with a structure where an inorganic insulating material and an organic insulating material are alternately stacked, but is not limited thereto.

On the encapsulation layer 300, a cover substrate 400 can be formed. The cover substrate 400 can be formed of the same material as a material of the substrate 100. Such cover substrate 400 can be adhered to the encapsulation layer 300 through an adhesive and the like.

In various embodiments, a color filter 410 can be further formed between the encapsulation layer 300 and the cover substrate 400. The color filter 410 can be disposed in the light emitting area (EA). The color filter 410 is a wavelength-selective optic filter which selectively transmits only certain wavelength band of the incident light by transmitting light of a certain wavelength band and blocking light of another certain wavelength band, and can be formed of a photosensitive resin which includes a colorant such as a pigment or dye. The light generated in the light emitting diode (LD) and passed through the color filter 410 can have one color among red, green, blue and the like. If a pixel (PX) displays a white color, the color filter 410 can be omitted for the corresponding pixel (PX).

Hereinafter, a detailed configuration of various examples of the auxiliary electrode contact portion (CA) will be described according to the present disclosure.

Figure 4:
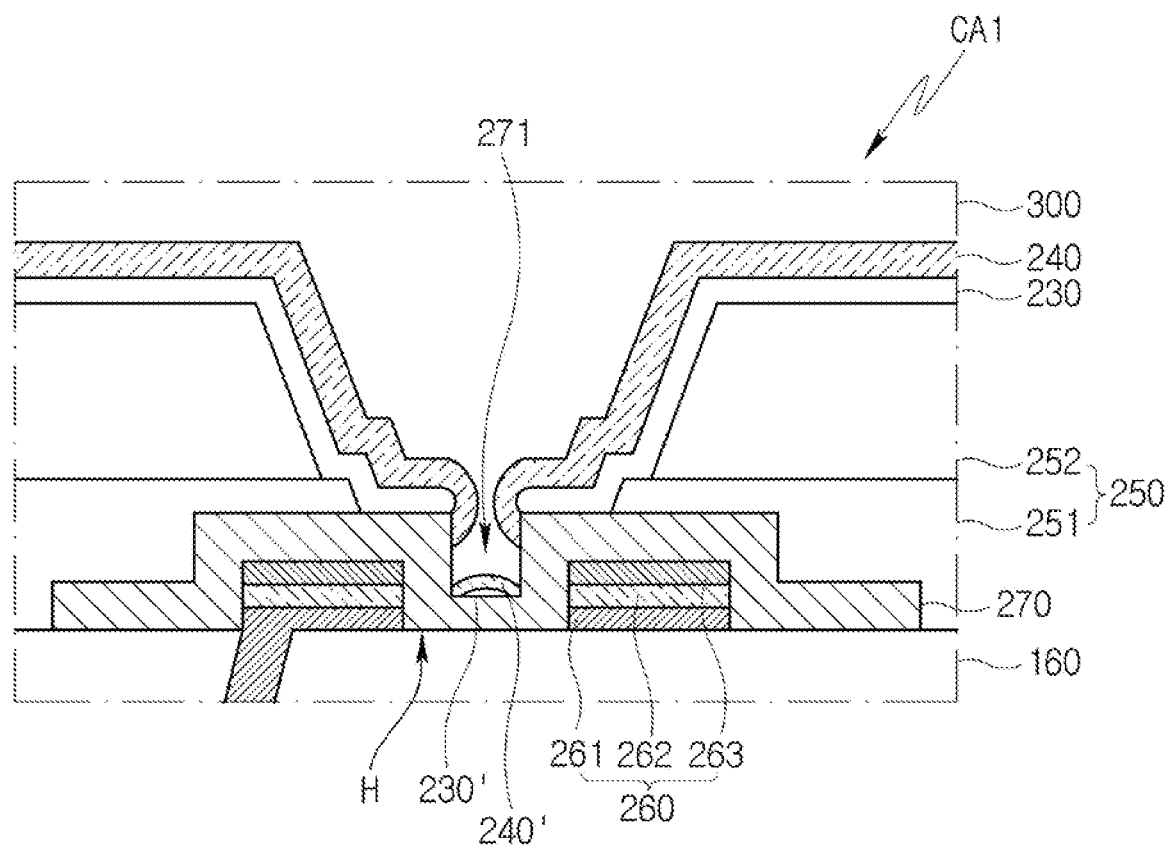
FIG. 4 is a cross-sectional view of an auxiliary electrode contact portion according to a first example of the present disclosure.
Figure 5:
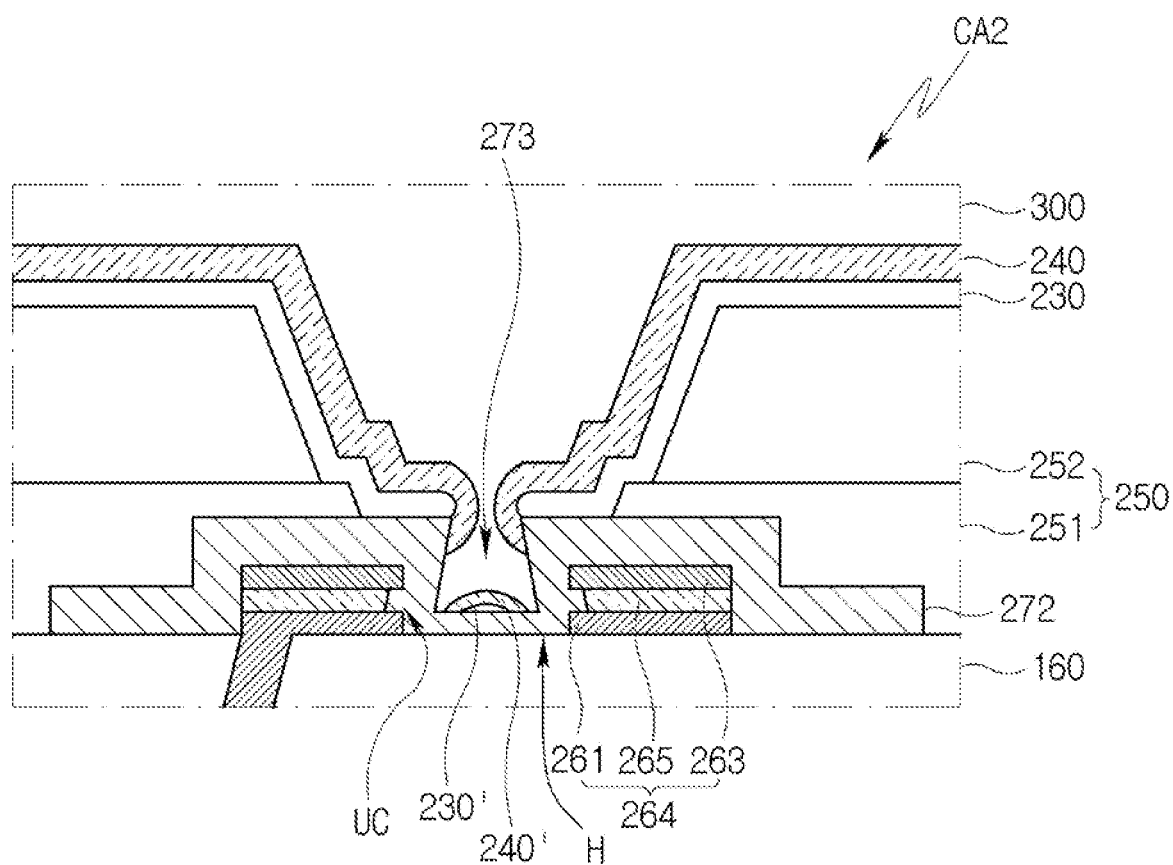
FIG. 5 is a cross-sectional view of an auxiliary electrode contact portion according to a second example of the present disclosure.
Figure 6:
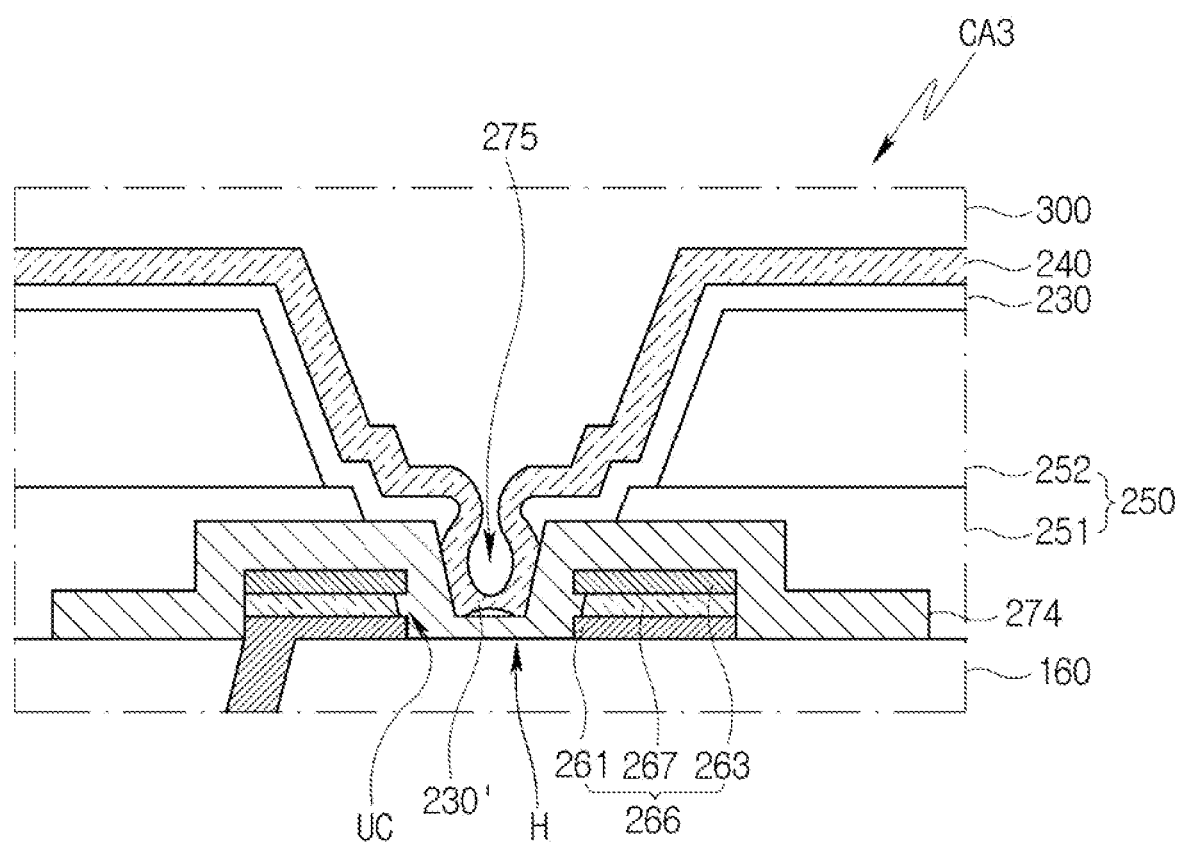
FIG. 6 is a cross-sectional view of an auxiliary electrode contact portion according to a third example of the present disclosure.
Figure 7:
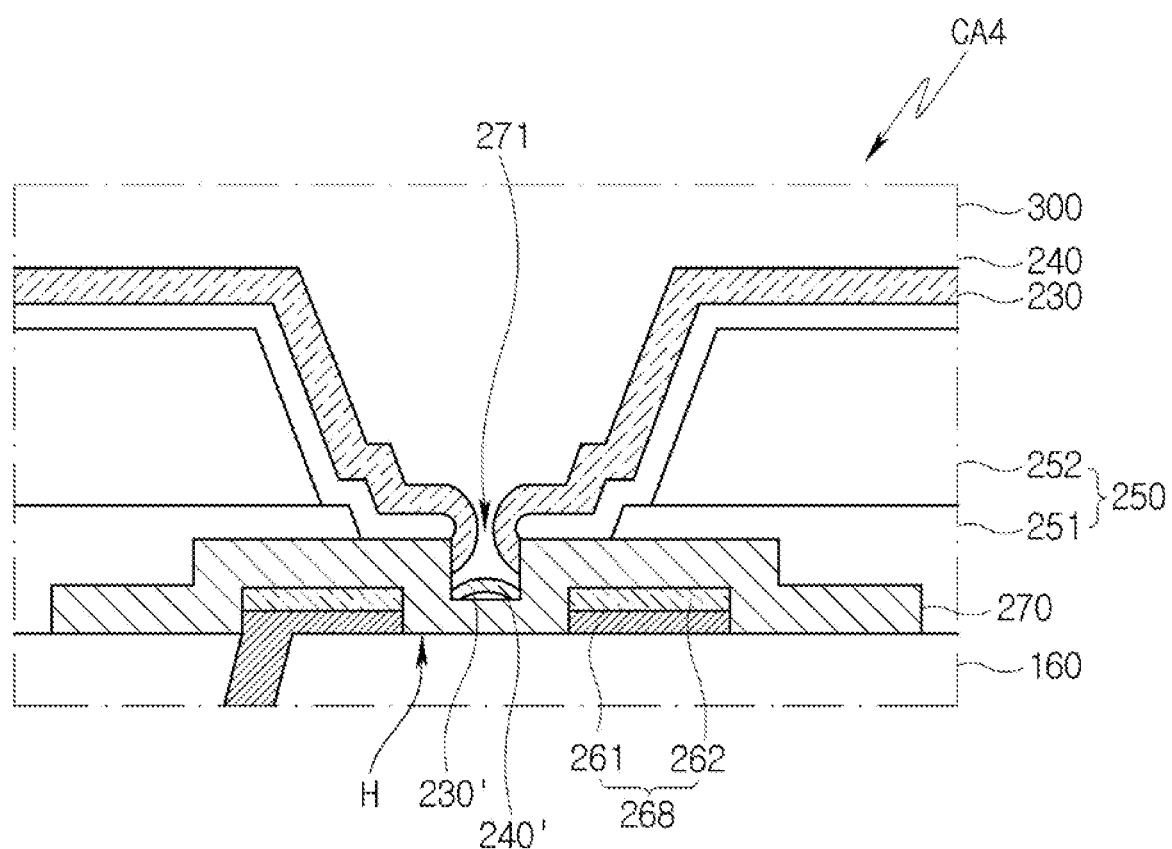
FIG. 7 is a cross-sectional view of an auxiliary electrode contact portion according to a fourth example of the present disclosure.
Figure 8:
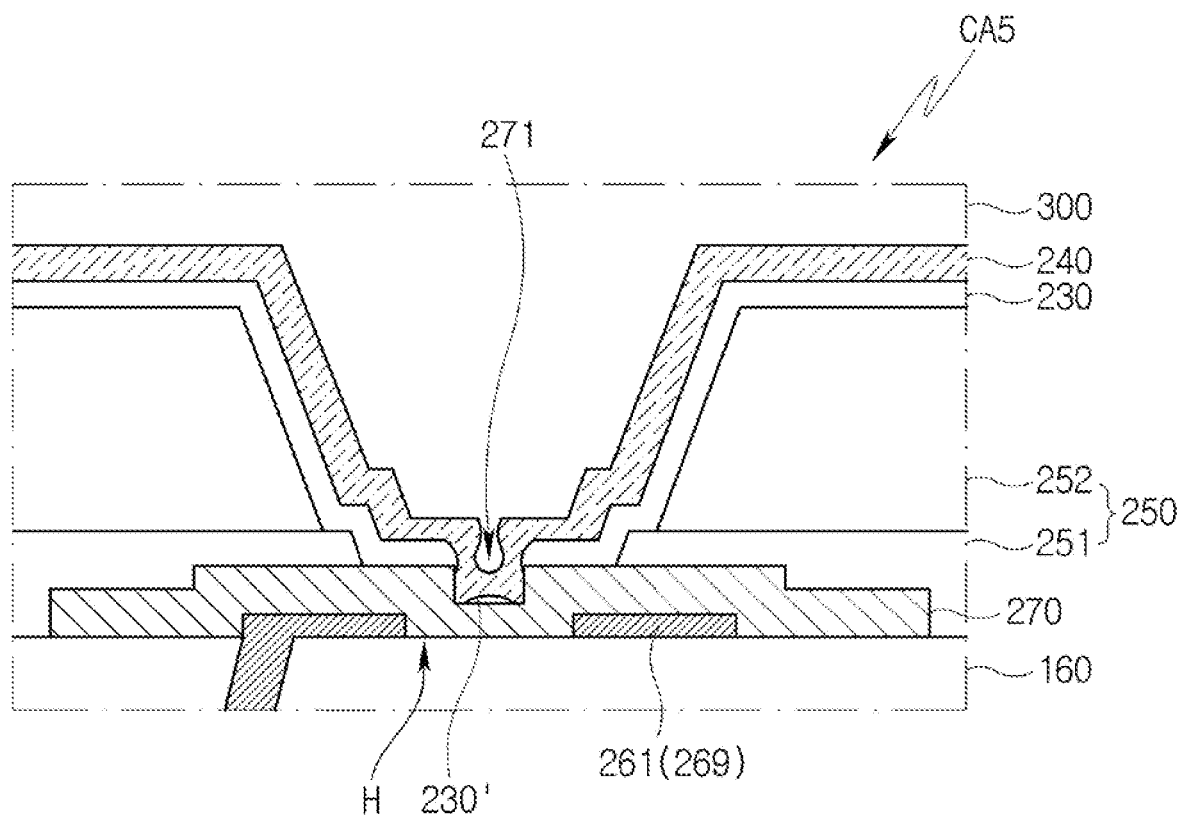
FIG. 8 is a cross-sectional view of an auxiliary electrode contact portion according to a fifth example of the present disclosure.
Figure 9:
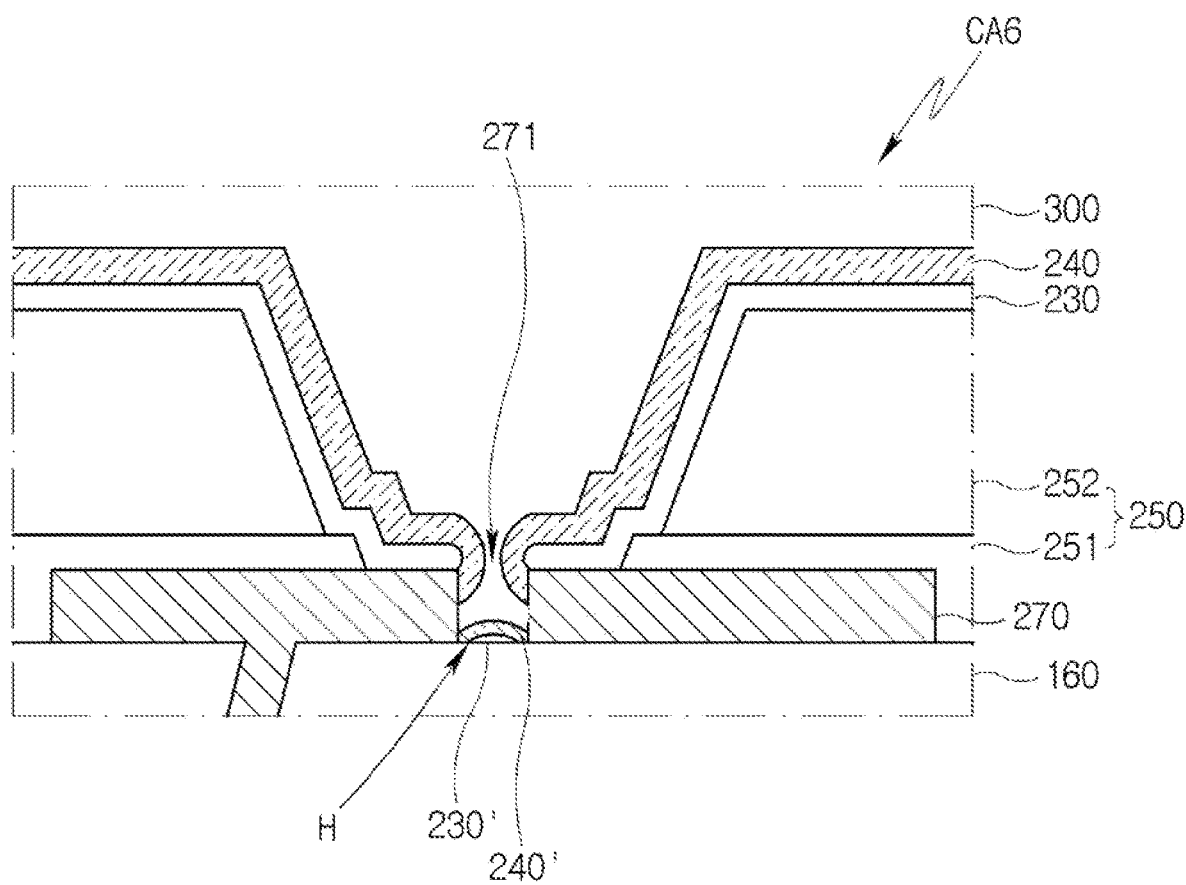
FIG. 9 is a cross-sectional view of an auxiliary electrode contact portion according to a sixth example of the present disclosure.

Particularly, FIG. 4 is a cross-sectional view of an auxiliary electrode contact portion (CA1) according to a first example of the present disclosure. FIG. 5 is a cross-sectional view of an auxiliary electrode contact portion (CA2) according to a second example of the present disclosure. FIG. 6 is a cross-sectional view of an auxiliary electrode contact portion (CA3) according to a third example of the present disclosure. FIG. 7 is a cross-sectional view of an auxiliary electrode contact portion (CA4) according to a fourth example of the present disclosure. FIG. 8 is a cross-sectional view of an auxiliary electrode contact portion (CA5) according to a fifth example of the present disclosure. FIG. 9 is a cross-sectional view of an auxiliary electrode contact portion (CA6) according to a sixth example of the present disclosure.

With reference to FIGS. 3 and 4 which show the CAL the light emitting diode layer can further include an auxiliary electrode 260 to connect the cathode electrode 240 and the connecting electrode 140. The auxiliary electrode 260 is formed on the same layer as the anode electrode 210 and can be disposed in the auxiliary electrode contact portion (CA1). The auxiliary electrode 260 contacts with the connecting electrode 140 through the contact hole penetrating the overcoat layer 160 and the passivation layer 150. Since the connecting electrode 140 is connected to the second power line (PL2) through the auxiliary wiring 110, the auxiliary electrode 260 can be connected to the second power line (PL2).

The auxiliary electrode 260 can be formed of the same material as the anode electrode 210 and can be formed by the same process as the process of the anode electrode 210. In the embodiment, the auxiliary electrode 260 can be formed with a three-layer structure composed of a first transparent conductive layer 261, a reflective layer 262 (a metal oxide layer) and a second transparent conductive layer 263. For example, the auxiliary electrode 260 can be formed of a three-layer including indium tin oxide (ITO), silver (Ag) and indium tin oxide (ITO).

In the auxiliary electrode 260, an electrode hole (H) can be formed. At least one or more electrode holes (H) can be patterned on the auxiliary electrode 260. Such auxiliary electrode 260 can be formed, for example, by stacking the first transparent conductive layer 261, the reflective layer 262 and the second transparent conductive layer 263 in order and performing a batch etching (for example, wet etching) onto the three-layers in a state a mask including a pattern corresponding to the electrode hole (H) is applied. At this time, one area of the overcoat layer 160 stacked below the auxiliary electrode 260 can be exposed to the upper portion by the electrode hole (H). Also, on the inner side surface of the electrode hole (H), the reflective layer 262 disposed between the two transparent conductive layers 261, 263 can be exposed.

The auxiliary electrode 260 can be covered by the transparent conductive layer 270. The transparent conductive layer 270 can cover an auxiliary electrode 260 where the electrode hole (H) is patterned and one area of the overcoat layer 160 exposed by the electrode hole (H). At this time, in the periphery of the electrode hole (H) of the auxiliary electrode 260, a step difference is formed in the transparent conductive layer 270. Accordingly, a concave portion 271 covering the electrode hole (H) can be formed in (or defined by) the transparent conductive layer 270.

The transparent conductive layer 270 covers the auxiliary electrode 260 as a whole, and can be formed to be wider than the auxiliary electrode 260. Due to the transparent conductive layer 270, the overall tip length of the auxiliary electrode contact portion (CA1) can increase. Accordingly, the electrical connection between the auxiliary electrode 260 and the cathode electrode 240 can be established stably and easily in the auxiliary electrode contact portion (CA1). In the embodiment, a thickness of the transparent conductive layer 270 can be at or about 140 Å~500 Å, but is not limited thereto.

The transparent conductive layer 270 can be formed of a transparent conductive material such as ITO, IZO or ZnO and the like. For example, the transparent conductive layer 270 can be formed of the same material as a material forming a transparent conductive layer constituting the auxiliary electrode 260. However, the present disclosure is not limited thereto.

The bank 250 can be formed to expose one area of the transparent conductive layer 270. For example, the bank 250 can be formed to expose the concave portion 271 of the transparent conductive layer 270, and to cover the remaining areas thereof. The exposed area of the transparent conductive layer 270 not covered by the bank 250 can be defined as the auxiliary electrode contact portion (CA1) of the pixels (PX) in one example.

In the embodiment, an opening corresponding to the auxiliary electrode contact portion (CA1) can be formed by performing an etching process. The etching process can be performed, for example, in a way of applying a selective etchant in a state a mask is applied in the bank 250. After performing the etching process, by removing the mask and residue of the etchant through the ashing process, it becomes possible to completely expose the transparent conductive layer 270 to the outside in the auxiliary electrode contact portion (CA1).

During the ashing process, the transparent conductive layer 270 can protect the inner side surface of the electrode hole (H). The reflective layer 262 exposed on the inner side surface of the electrode hole (H) may form dark spots in the display panel 50 due to particles generated during the ashing process. In the present embodiment, the inner side surface of the electrode hole (H) is covered by the transparent conductive layer 270 and, therefore, it becomes possible to prevent generation of particles during the ashing process and to protect the electrode hole (H).

Further, the organic layer 230 and the cathode electrode 240 are widely formed in the substrate 100, therefore they cover the exposed one area of the transparent conductive layer 270. At this time, the organic layer 230 having relatively inferior step coverage characteristic may be cut off in the periphery of the concave portion 271 of the transparent conductive layer 270. For example, the periphery of the concave portion 271 can include a surface or upper surface of the transparent conductive layer 270, which is adjacent to or surrounding the concave portion 271. As such, the organic layer 230 is disposed on the upper surface of the transparent conductive layer 270, which is exposed by the bank 251, but is not disposed (or is cut off) on any inside surface of the concave portion 271. In the embodiment, the organic layer 230 can be cut off on the inner side surface of the concave portion 271, but is not limited thereto. As the organic layer 230 is cut off, a portion of the inner side surface of the concave portion 271 of the transparent conductive layer 270 can be exposed, without being covered by the organic layer 230.

On the other hand, the cathode electrode 240 having relatively good step coverage characteristic is formed continuously in the periphery of the concave portion 271 of the transparent conductive layer 270. In the embodiment, the cathode electrode 240 can be cut off in the periphery of the concave portion 271 as illustrated. For example, the cathode electrode 240 can be cut off on the inner side surface of the concave portion 271. The step coverage characteristic of the cathode electrode 240 is better than the step coverage characteristic of the organic layer 230, and thus, the cathode electrode 240 can directly contact the inner side surface of the concave portion 271 which is not covered by the organic layer 230.

The residues of the organic layer 230 which is cut off and the cathode electrode 240 may pile up in the concave portion 271. In other words, the organic layer 230 and the cathode electrode 240 are cut off in the periphery of the concave portion 271 and a residue 230' of the organic layer 230 and a residue 240' of the cathode electrode 240 may be subsequently present within the concave portion 271 in the transparent conductive layer 270.

As above, the cathode electrode 240 directly contacts the transparent conductive layer 270 in the auxiliary electrode contact portion (CA1). The cathode electrode 240 is contacted with the connecting electrode 140 through the transparent conductive layer 270 and the auxiliary electrode 260. Since the connecting electrode 140 is connected to the second power line (PL2) through the auxiliary wiring 110, the cathode electrode 240 can be connected to the second power line (PL2).

Referring to FIG. 5, the second example of the auxiliary electrode contact portion (CA2) will now be discussed.

Compared with the embodiment of FIG. 4, in the auxiliary electrode contact portion (CA2) according to the second example, a selective etchant used for the etching process of the electrode hole (H) can have higher reactivity to the reflective layer 265 of the auxiliary electrode 264 than to the transparent conductive layers 261, 263. Accordingly, since the reflective layer 265 is over-etched, an undercut (UC) can occur between the transparent conductive layers 261, 263 each on an upper portion and a lower portion of the reflective layer 265. In other words, the reflective layer 265 is further recessed on an inner side surface than the transparent conductive layers 261, 263 each on an upper portion and a lower portion thereof.

In such an embodiment, the exposed side surface of the reflective layer 265 can have a reverse taper (or tapered) shape. The concave portion 273 of the transparent conductive layer 272 that covers the auxiliary electrode 264 can have a side surface that takes the form of a reverse taper along the shape of the auxiliary electrode 264. For example, the reverse taper shape of the concave portion 273 can have a trapezoid shape with a top width smaller than a bottom width.

Then, the organic layer 230 having an inferior step coverage characteristic can be further easily cut off in the periphery of the concave portion 273 of the transparent conductive layer 272. When an inner side surface of the concave portion 273 of the transparent conductive layer 272 is exposed in a wider area by the cut-off of the organic layer 230, the cathode electrode 240 to be formed after the organic layer 230 is formed can contact more properly with the transparent conductive layer 272 on the inner side surface of the concave portion 273.

When the cathode electrode 240 is directly contacted with the transparent conductive layer 272 in a wider area, an electric resistance between the cathode electrode 240 and the transparent conductive layer 272 decreases, thereby power transfer can be efficiently performed.

Referring to FIG. 6, the third example of an auxiliary electrode contact portion (CA3) will now be discussed.

Compared with the second example of FIG. 5, in the auxiliary electrode contact portion (CA3) according to the third example, a selective etchant used for the etching process of the electrode hole (H) can have higher reactivity to the reflective layer 267, than to the transparent conductive layers 261, 263. Accordingly, since the reflective layer 267 is over-etched, an undercut (UC) can occur between the transparent conductive layers 261, 263 each on an upper portion and a lower portion of the reflective layer 267. For example, on the inner side surface of the electrode hole (H), the reflective layer 267 is further recessed towards the outside than the transparent conductive layers 261, 263 each on an upper portion and a lower portion thereof.

In such an embodiment, an exposed side surface of the reflective layer 267 can take a form of a taper. The concave portion 275 of the transparent conductive layer 274 that covers the auxiliary electrode 266 can have a side surface that takes the form of a taper along the shape of the auxiliary electrode 266. For example, the taper shape of the concave portion 275 can have an inverted trapezoid shape with a top width larger than a bottom width.

Then, the cathode electrode 240 having a good step coverage characteristic can be easily and continuously formed without cut-off in the concave portion 275 of the transparent conductive layer 274. In such an embodiment, the cathode electrode 240 is formed to entirely cover the residue 230' of the organic layer 230 formed in the concave portion 275. The organic layer 230 preferably is formed on the periphery of the concave portion 275 and may not be formed on the inner surface of the concave portion 275. However, it is possible that a small portion of the organic layer 230 can be formed on an upper inside edge area of the concave portion 275.

When continuity of the cathode electrode 240 is maintained mostly without being cut-off in the transparent conductive layer 274, an area where the cathode electrode 240 and the transparent conductive layer 274 directly contact with each other increases, and an electric resistance between the cathode electrode 240 and the transparent conductive layer 274 decreases. As a result, contact accuracy can be improved. Further, power transfer to the cathode electrode 240 can be efficiently performed, and power consumption of the display panel 50 can decrease which is beneficial.

Referring to FIG. 7, the fourth example of an auxiliary electrode contact portion (CA4) will now be discussed.

Compared with the first example of FIG. 4, in the auxiliary electrode contact portion (CA4) according to the fourth example, the auxiliary electrode 268 can be formed of a double layer where the transparent conductive layer 261 and the reflective layer 262 are stacked. For example, the auxiliary electrode 268 can be formed of a double layer of indium tin oxide (ITO) and silver (Ag).

In such an embodiment, the reflective layer 262 is exposed completely upon the auxiliary electrode 268. The transparent conductive layer 270 covers the entire exposed area of the reflective layer 262. This embodiment can prevent generation of particle in the reflective layer 262.

Referring to FIG. 8, the fifth example of an auxiliary electrode contact portion (CA5) will now be discussed.

Compared with the first example of FIG. 4, in the auxiliary electrode contact portion (CA5) according to the fifth example, the auxiliary electrode 269 can be formed of a single layer of the transparent conductive layer 261. For example, the auxiliary electrode 269 can be formed by including indium tin oxide (ITO).

The transparent conductive layer 270 covers the auxiliary electrode 269. The transparent conductive layer 270 covers the auxiliary electrode 269 as a whole, and can be formed wider than the auxiliary electrode 269. Through the transparent conductive layer 270, the overall electrode tip length of the auxiliary electrode contact portion (CA5) can increase. Accordingly, an electric connection between the auxiliary electrode 269 and the cathode electrode 240 can be formed stably and easily in the auxiliary electrode contact portion (CA5).

Referring to FIG. 9, the sixth example of an auxiliary electrode contact portion (CA6) will now be discussed.

Compared with the first example of FIG. 4, the auxiliary electrode contact portion (CA6) according to the sixth example omits the auxiliary electrode 260 and includes the transparent conductive layer 270 only. Since the auxiliary electrode contact portion (CA6) includes the transparent conductive layer 270 only, particles are not generated during the ashing process of the bank 250. Moreover, the transparent conductive layer 270 is formed relatively wider in the auxiliary electrode contact portion (CA6), and an electrode tip length of the auxiliary electrode contact portion (CA6) can increase.

FIGS. 10 to 16 are cross-sectional views for illustrating a manufacturing method of a display device including the auxiliary electrode contact portion according to an embodiment. In FIGS. 10 to 16, for convenience of description, illustrations of layers disposed below the overcoat layer 160 are omitted. However, as explained with reference to FIG. 3, the circuit elements, the auxiliary wiring 110 and the connecting electrode 140 and the like can be formed below the overcoat layer 160.

Further, FIGS. 10 to 16 illustrate the process of forming the first example of the auxiliary electrode contact portion (CA1) as an example, and can be relied on to understand the process of forming the second, third, fourth, fifth and six examples of the auxiliary electrode contact portion (CA2 to CA6) according to one or more embodiments of the present disclosure.

Figure 10:
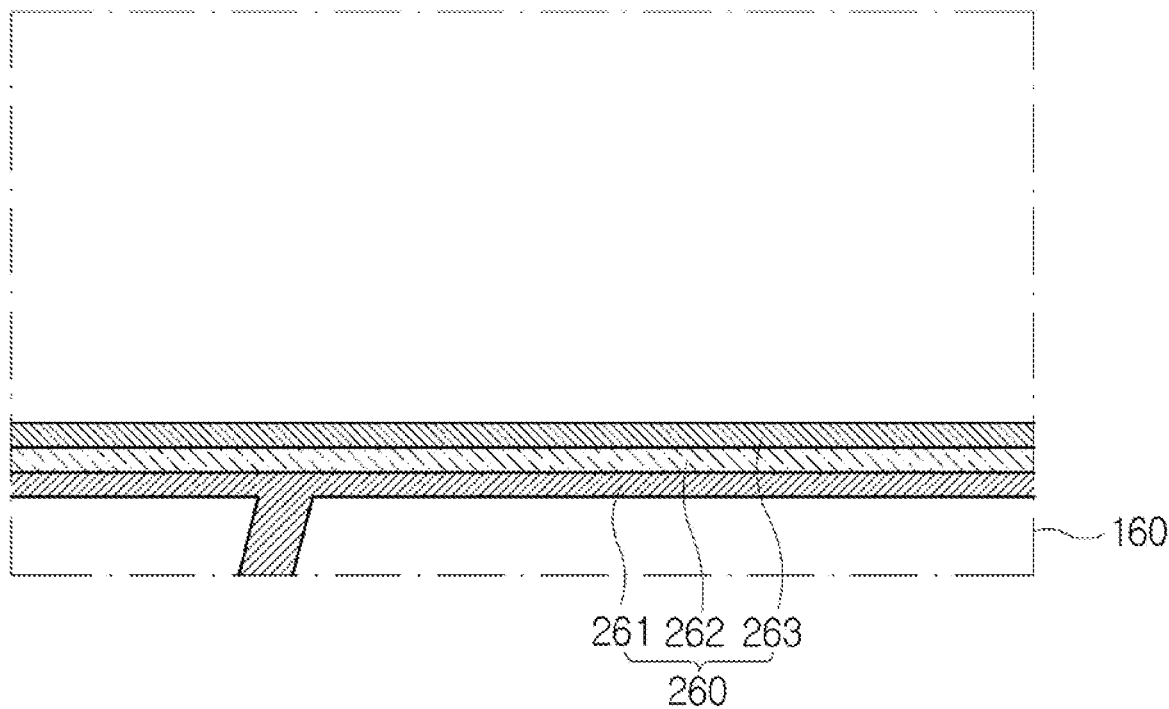
FIGS. 10 to 16 are cross-sectional views for explaining a manufacturing method of a display device according to an embodiment of the present disclosure.
Figure 11:
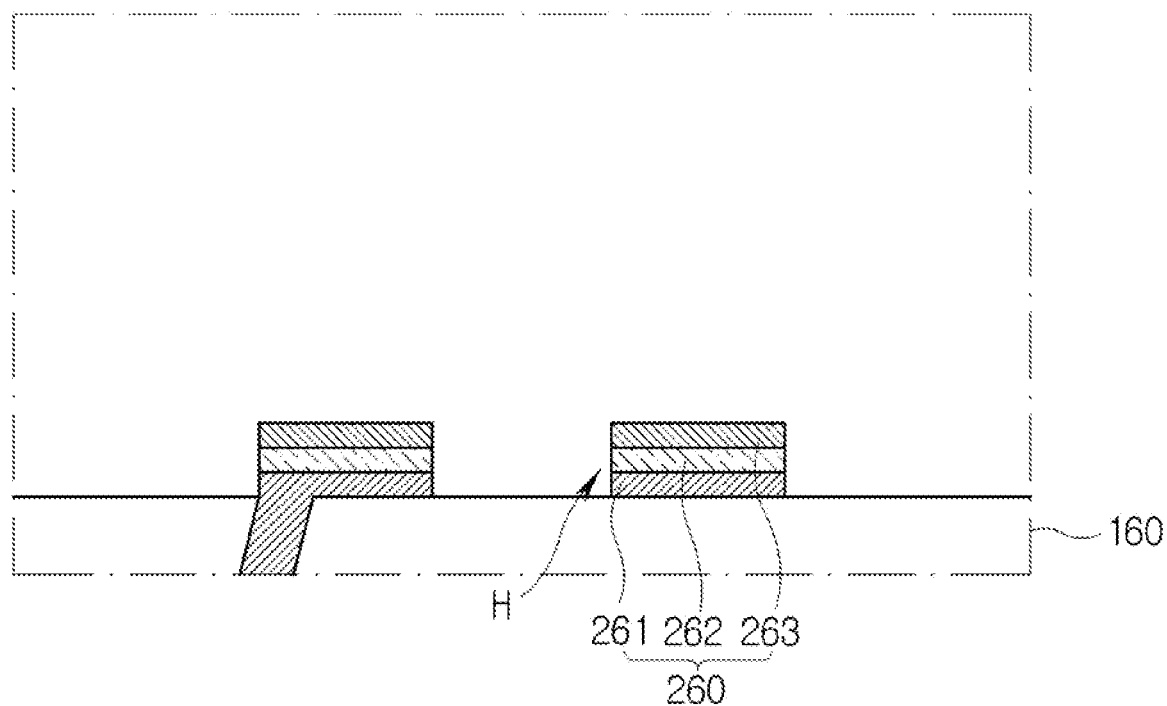

With reference to FIGS. 10 and 11, the auxiliary electrode 260 is formed on the overcoat layer 160 in the auxiliary electrode contact portion (CA). The auxiliary electrode 260 is connected to the connecting electrode 140 (FIG. 3).

The auxiliary electrode 260 can be formed of three layers composed of the transparent conductive layer 261, the reflective layer 262 and the transparent conductive layer 263. The transparent conductive layers 261, 263 can be formed of, for example, indium tin oxide (ITO), and the reflective layer 262 can be formed of, for example, a metal material such as silver or a silver alloy. In the auxiliary electrode 260, at least one electrode hole (H) is formed. On an inner side surface of the electrode hole (H), the transparent conductive layer 261, the reflective layer 262 and the transparent conductive layer 263 constituting the auxiliary electrode 260 can be exposed.

The auxiliary electrode 260 can be formed by applying a batch etching (for example, wet etching) onto the three layers in a state a mask including a pattern corresponding to the electrode hole (H) is applied as illustrated in FIG. 11, after stacking the transparent conductive layer 261, the reflective layer 262 and the transparent conductive layer 263 in that order as illustrated in FIG. 10.

Figure 12:
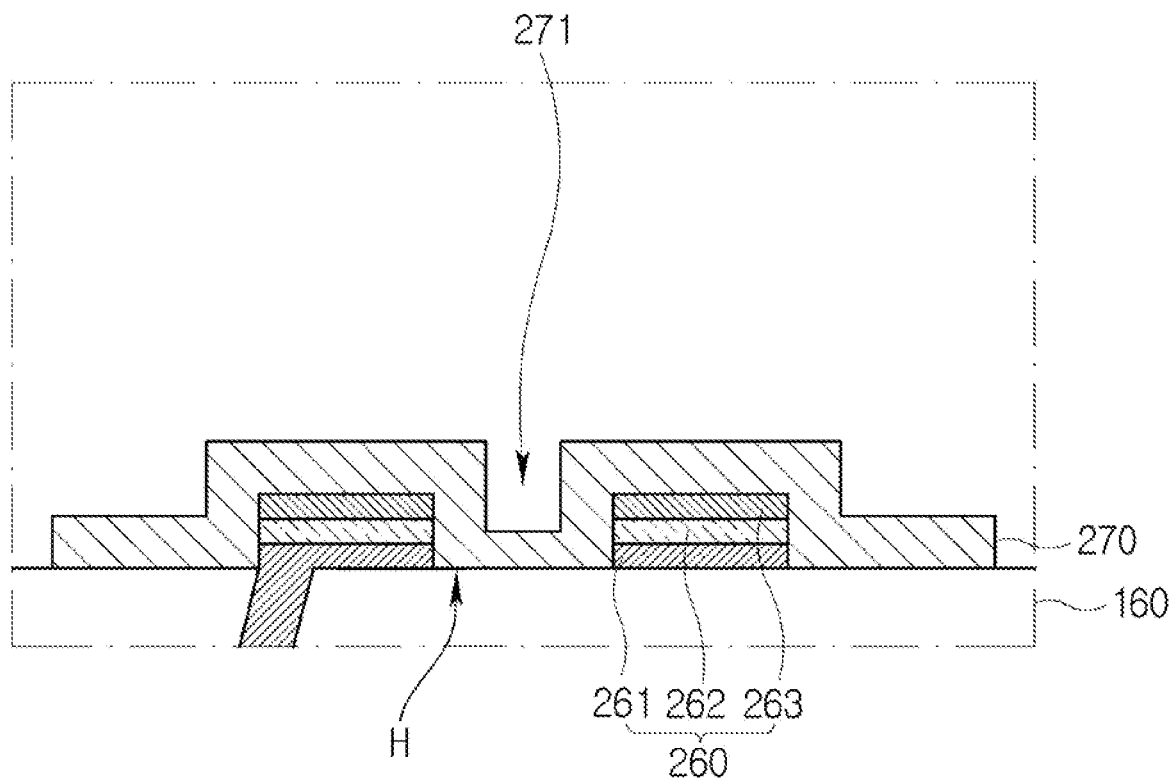

Referring to FIG. 12, the transparent conductive layer 270 can be formed on the auxiliary electrode 260 thereafter. The transparent conductive layer 270 can be formed to cover one area of the overcoat layer 160 exposed by the electrode hole (H), and the auxiliary electrode 260 in which the electrode hole (H) is patterned. At this time, in the periphery of the electrode hole (H) of the auxiliary electrode 260, a step difference is formed in the transparent conductive layer 270. Accordingly, the concave portion 271 that covers the electrode hole (H) of the transparent conductive layer 270 can be formed.

The transparent conductive layer 270 covers the auxiliary electrode 260 as a whole, and can be formed wider than the auxiliary electrode 260. Through the transparent conductive layer 270, an overall electrode tip length of the auxiliary electrode contact portion (CA) can increase. Then, an electric connection between the auxiliary electrode 260 and the cathode electrode 240 can be achieved in the auxiliary electrode contact portion (CA) stably and easily. In the embodiment, a thickness of the transparent conductive layer 270 can be at or about 140 Å~500 Å, but is not limited thereto.

The transparent conductive layer 270 can be formed of a transparent conductive material such as ITO, IZO or ZnO and the like. For example, the transparent conductive layer 270 can be formed of the same material as a material forming the transparent conductive layer that forms the auxiliary electrode 260. However, the present disclosure is not limited thereto.

Figure 13:
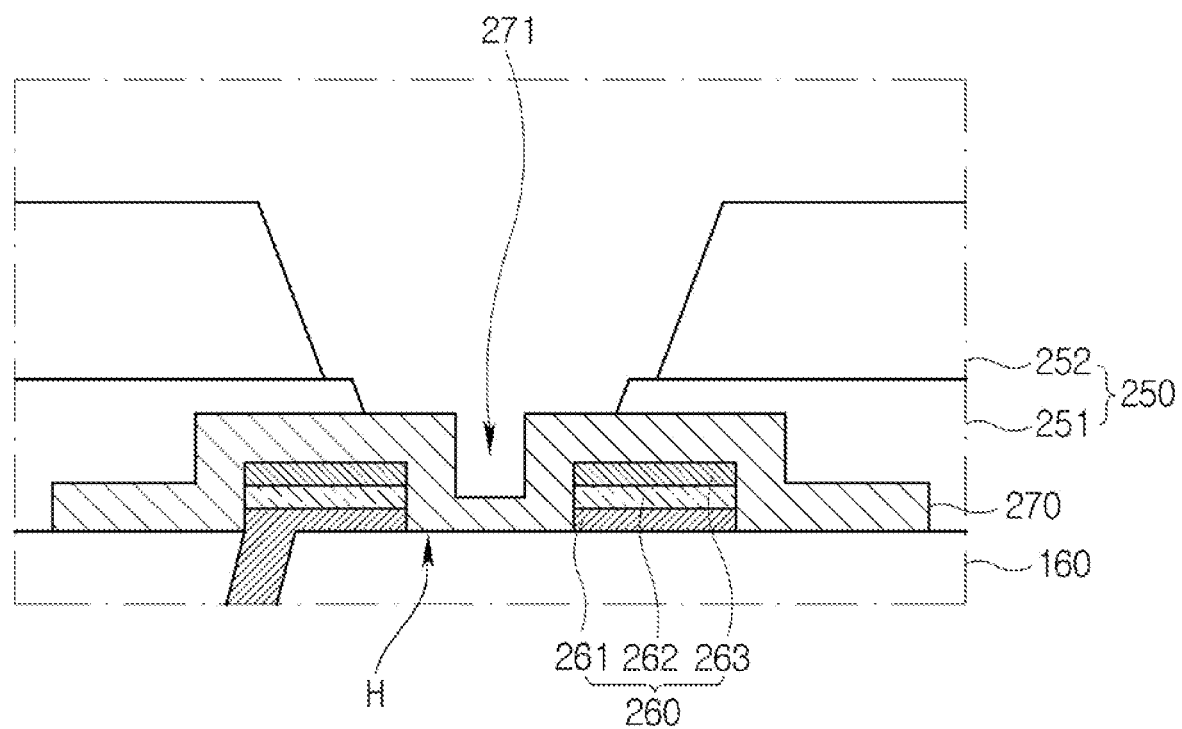

With reference to FIG. 13, the bank 250 can be formed on the transparent conductive layer 270 thereafter. The bank 250 can be formed to expose one area of the transparent conductive layer 270, for example, the periphery of the concave portion 271, and to cover the remaining area.

In the embodiment, the bank 250 can have a structure where the hydrophilic bank 251 and the hydrophobic bank 252 are stacked. The hydrophilic bank 251 is formed of a hydrophilic inorganic insulating material such as silicon dioxide ($SiO_2$) or silicon nitride ($SiN_x$), thereby making a solution to spread well when forming the light emitting layer.

The hydrophobic bank 252 can be formed in some area of the hydrophilic bank 251. When it comes to the hydrophobic bank 252, at least some portion of the surface thereof can be formed to be hydrophobic. For example, the hydrophobic bank 252 can be formed through a photolithography process after applying a solution that mixed an organic insulating material with a hydrophobic material such as fluorine (F). A hydrophobic material such as fluorine (F) can move to an upside of the hydrophobic bank 252 by light radiated during the photolithography process and accordingly, the upside surface of the hydrophobic bank 252 has a hydrophobic property, and the remaining area can possess a hydrophilic property.

In such an embodiment, after the hydrophilic bank 251 is formed on the transparent conductive layer 270, the hydrophobic bank 252 can be formed in the hydrophilic bank 251. Specifically, the hydrophilic bank 251 can be formed by etching an inorganic insulating layer in a state a mask corresponding to a shape of the hydrophilic bank 251 is applied, after stacking a hydrophilic inorganic insulating layer on the transparent conductive layer 270. After the etching process, the electrode hole (H) of the auxiliary electrode 260 stacked below and the periphery thereof can be exposed to the upside.

After the etching process of the hydrophilic bank 251, an ashing process can be conducted to remove the mask and the residue. During the ashing process, the transparent conductive layer 270 can protect an inner side surface of the electrode hole (H). Since the inner side surface of the electrode hole (H) is covered by the transparent conductive layer 270, it is possible to prevent particle generation during the ashing process.

Thereafter, the hydrophobic bank 252 can be formed through the photolithography process, after applying a solution that mixed an organic insulating material with a hydrophobic material such as fluorine (F) to the hydrophilic bank 251.

Figure 14:
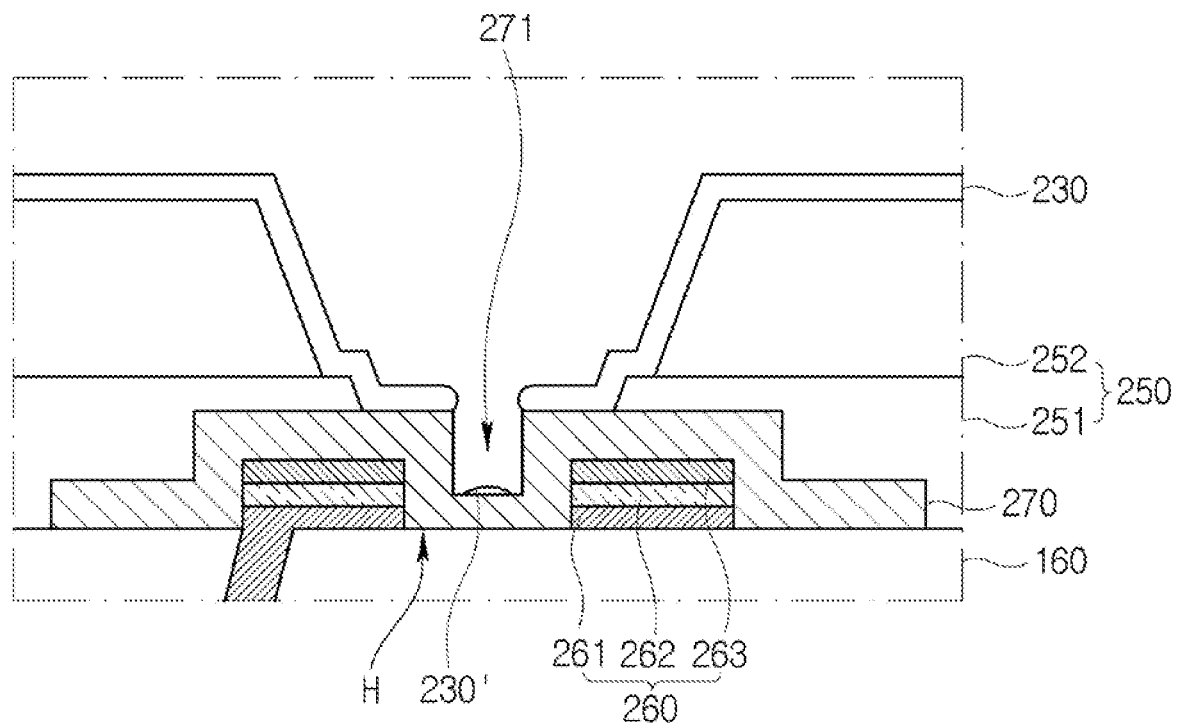

Referring to FIG. 14, the organic layer 230 is formed. The organic layer 230 is formed in a wide area through an evaporation deposition such as a thermal evaporation deposition or a physics vapor deposition such as sputtering, and can cover the bank 250 and the transparent conductive layer 270. In the embodiment, the organic layer 230 can be cut off in the periphery of the concave portion 271 of the transparent conductive layer 270 due to the step coverage characteristic. As the organic layer 230 is cut off, a portion of the inner side surface of the concave portion 271 in the transparent conductive layer 270 can be exposed without being covered by the organic layer 230. The residue 230' of the organic layer 230 that is cut off can pile up in the concave portion 271.

Figure 15:
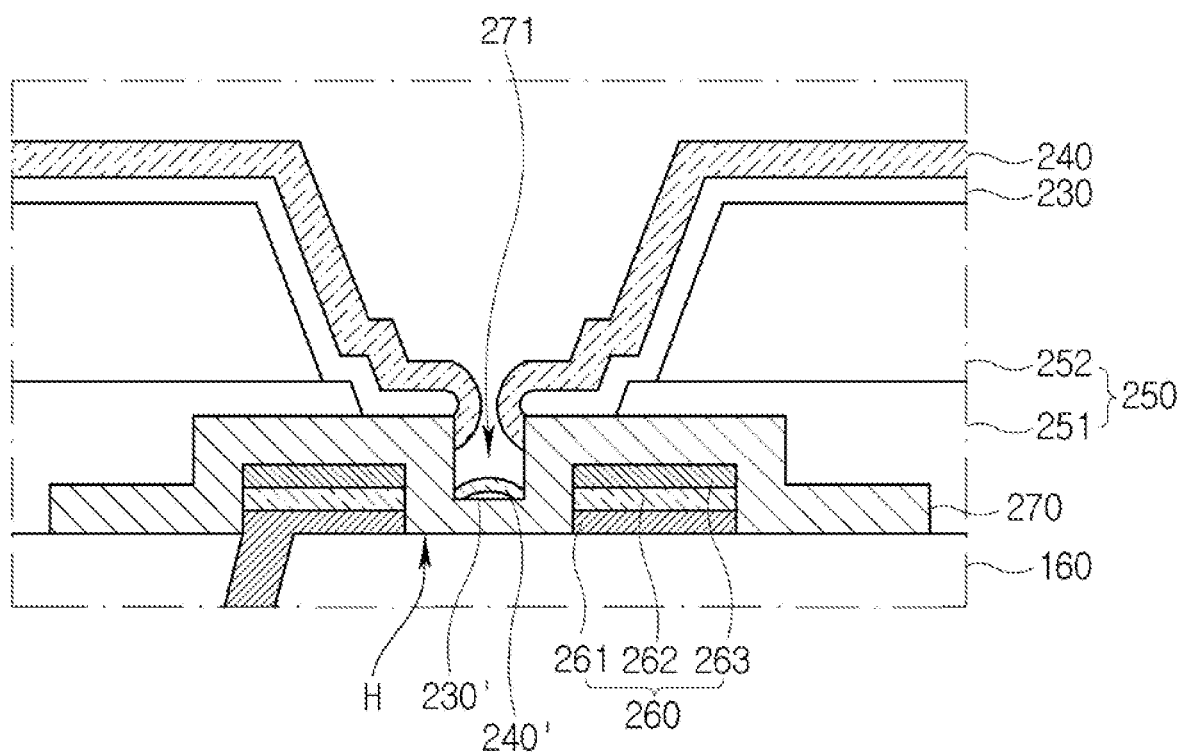

Referring to FIG. 15, the cathode electrode 240 is formed on the organic layer 230. The cathode electrode 240 can be formed in a wide area through an evaporation deposition such as a thermal evaporation deposition or a physics vapor deposition such as sputtering, and can cover the organic layer 230. The cathode electrode 240 can be cut off in the inner side surface of the concave portion 271 by the step coverage characteristic. Since the step coverage characteristic of the cathode electrode 240 is better than the step coverage characteristic of the organic layer 230, the cathode electrode 240 can directly contact with the inner side surface of the concave portion 271 which is not covered by the organic layer 230. The residue 240' of the cathode electrode 240 which is cut off can pile up in the concave portion 271.

Figure 16:
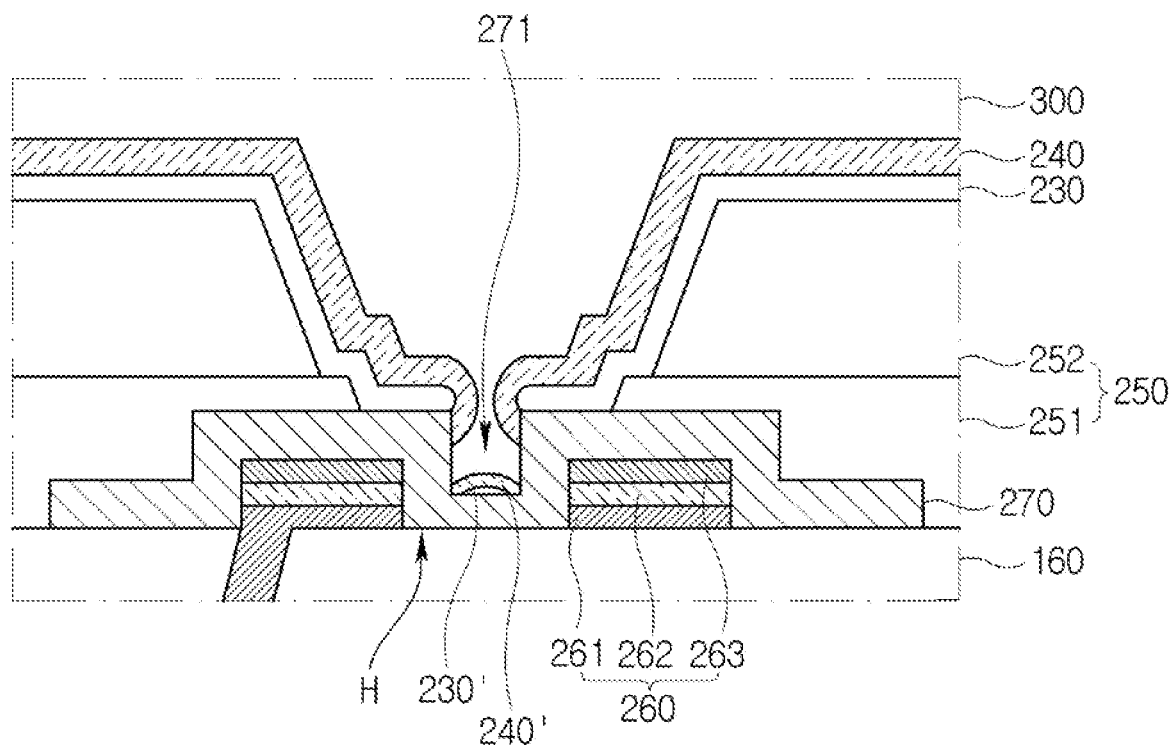

With reference to FIG. 16, the encapsulation layer 300 can be formed on the cathode electrode 240. Depending on embodiments, various functional layers such as a protective layer, a polarization layer, a touch screen and the like can be further stacked on the encapsulation layer 300.

A display device and a manufacturing method thereof according to the embodiments can prevent generation of particles on a side of an electrode hole when fulfilling an ashing process to a bank for the purpose of an auxiliary electrode contact, by covering a side of an electrode hole, which is patterned on an auxiliary electrode, with a transparent conductive layer. Accordingly, the display device and the manufacturing method thereof according to the embodiments can solve or address particles being recognized as dark spots in an auxiliary electrode contact portion.

In addition, the display device and the manufacturing method thereof according to the embodiments can improve efficiency of an auxiliary electrode contact, by increasing a tip length of an auxiliary electrode.

The display device and the manufacturing method thereof according to the embodiments can allow a contact between a cathode electrode and an auxiliary electrode easier, and can decrease resistance between the cathode electrode and the auxiliary electrode.

Those skilled in the art can understand that the present disclosure described herein can be implemented in other concrete forms without departing from the technical concept or essential features thereof. Thus, it should be understood that embodiments described hereinabove are examples in all aspects, and do not limit the present disclosure.

The scope of the present disclosure is denoted by the claims that are provided hereinbelow, rather than the detailed description. In addition, it should be construed that all modifications or variations that are derived from the meaning, scope and the concept of equivalence of the claims are covered in the scope of the present disclosure.

What is claimed is:

1. A display device comprising:
a substrate including a light emitting area and an auxiliary electrode contact portion for providing an electrical connection with one or more elements;
an auxiliary electrode disposed in the auxiliary electrode contact portion, and having an electrode hole;
a transparent conductive layer covering the auxiliary electrode, and having a concave portion above the electrode hole;
at least one bank disposed on the transparent conductive layer, and exposing the concave portion and an upper surface of the transparent conductive layer that is adjacent to the concave portion;
an organic layer disposed on the at least one bank and the exposed upper surface of the transparent conductive layer; and
a cathode electrode disposed on the organic layer and a side surface of the concave portion.

2. The display device of claim 1,
wherein the cathode electrode directly contacts an inner side surface of the concave portion of the transparent conductive layer.

3. The display device of claim 1,
wherein the cathode electrode substantially covers inner surfaces of the concave portion including residues of the organic layer disposed in the concave portion.

4. The display device of claim 1,
wherein the concave portion of the transparent conductive layer has a taper shape or a reverse taper shape.

5. The display device of claim 1,
wherein the transparent conductive layer is disposed to cover the entire auxiliary electrode and to have a wider area than the auxiliary electrode.

6. The display device of claim 1,
wherein the auxiliary electrode includes a first transparent conductive layer, a reflective layer and a second transparent conductive layer that are stacked, and
wherein the electrode hole is defined through the first transparent conductive layer, the reflective layer and the second transparent conductive layer that are stacked, and is covered by the transparent conductive layer.

7. The display device of claim 6,
wherein the reflective layer is further recessed from an inner side surface of the electrode hole than the first transparent conductive layer and the second transparent conductive layer.

8. The display device of claim 6,
wherein the reflective layer has a side surface in a reverse taper shape, and wherein the concave portion of the transparent conductive layer has a reverse taper shape based on the reverse taper shape of the side surface of the reflective layer.

9. The display device of claim 6,
wherein the reflective layer has a side surface in a taper shape, and
wherein the concave portion of the transparent conductive layer has a taper shape based on the taper shape of the side surface of the reflective layer.

10. The display device of claim 1,
wherein the auxiliary electrode includes a first transparent conductive layer and a reflective layer that are stacked, and
wherein the reflective layer is covered completely by the transparent conductive layer covering the electrode hole.

11. The display device of claim 1,
wherein the auxiliary electrode includes a first transparent conductive layer, and
wherein the first transparent conductive layer is covered completely by the transparent conductive layer covering the electrode hole.

12. The display device of claim 1, wherein the at least one bank includes:
a first bank disposed on the transparent conductive layer while exposing the upper surface of the transparent conductive layer, and
a second bank disposed on the first bank.

13. The display device of claim 12,
wherein the first bank is a hydrophilic bank, and
wherein the second bank is a hydrophobic bank.

14. A display device comprising:
a substrate including a light emitting area and an auxiliary electrode contact portion for providing an electrical connection with one or more elements;
a transparent conductive layer disposed in the auxiliary electrode contact portion, and functioning as an auxiliary electrode, the transparent conductive layer having a concave portion;
at least one bank disposed on the transparent conductive layer, and exposing the concave portion and an upper surface of the transparent conductive layer that is adjacent to the concave portion;
an organic layer disposed on the at least one bank and the exposed upper surface of the transparent conductive layer; and
a cathode electrode disposed on the organic layer and contacting an inner side surface of the concave portion of the transparent conductive layer.

* * * * *